(12) United States Patent
Harima

(10) Patent No.: US 8,072,276 B2
(45) Date of Patent: Dec. 6, 2011

(54) SURFACE MOUNT CRYSTAL OSCILLATOR

(75) Inventor: Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 48 days.

(21) Appl. No.: 12/653,077

(22) Filed: Dec. 8, 2009

(65) Prior Publication Data

US 2010/0156546 A1    Jun. 24, 2010

(30) Foreign Application Priority Data

Dec. 23, 2008  (JP) .................................. 2008-326682

(51) Int. Cl.
*H03B 1/00*    (2006.01)

(52) U.S. Cl. ............ 331/68; 331/69; 331/158; 310/340; 310/348

(58) Field of Classification Search .................... 331/68, 331/69, 158; 310/340, 348
See application file for complete search history.

(56) References Cited

U.S. PATENT DOCUMENTS

| 7,135,810 | B2* | 11/2006 | Okajima | 310/348 |
| 7,446,460 | B2* | 11/2008 | Yamamoto | 310/340 |
| 2005/0093171 | A1* | 5/2005 | Sugiura | 257/778 |
| 2006/0055479 | A1* | 3/2006 | Okazaki et al. | 331/158 |
| 2007/0228892 | A1* | 10/2007 | Koyama et al. | 310/348 |
| 2007/0252482 | A1* | 11/2007 | Sakai | 310/348 |

FOREIGN PATENT DOCUMENTS

| JP | 2008-180012 | 6/2004 |
| JP | 2007-082113 | 3/2007 |
| JP | 2008-78778 | 4/2008 |
| JP | 2008-109429 | 5/2008 |

OTHER PUBLICATIONS

Office Action issued by the Japanese Patent Office on Jan. 18, 2011 for the priority patent application No. JP2008-326682.

* cited by examiner

*Primary Examiner* — Joseph Chang
*Assistant Examiner* — Jeffrey Shin
(74) *Attorney, Agent, or Firm* — Scott D. Wofsy; Edwards Wildman Palmer LLP

(57) ABSTRACT

There is provided a surface mount oscillator of a junction type in which the size of an IC chip is increased while maintaining high performance thereof, and the outer dimension of the oscillator in plan view are small. In a surface mount crystal oscillator which: a surface of an IC chip opposite to one principal surface thereof on which IC terminals are formed, is fixed on a mount substrate; external terminals that are constituted by a pair of crystal terminals and dummy terminals, at least one of which serves as a ground terminal, and that are formed in four corner sections of an outer bottom surface of a surface mount vibrator, are electrically connected to the IC terminals provided in four corner sections of the one principal surface; and IC terminals provided in positions other than the four corner sections are connected to circuit terminals of the mount substrate by means of wire bonding, the configuration is such that the external terminals of the surface mount vibrator constituted by the crystal terminals and the dummy terminals are electrically joined by means of joining balls to the IC terminals formed in the four corner sections of the IC chip.

6 Claims, 2 Drawing Sheets

US 8,072,276 B2

SURFACE MOUNT CRYSTAL OSCILLATOR

BACKGROUND OF THE INVENTION

Technical Field

The present invention relates to a junction type surface mount crystal oscillator (hereunder, referred to as a "surface mount oscillator"), and in particular, to a surface mount oscillator in which the outer dimension of the oscillator is made small while the size of an IC chip is increased.

Background Art

A surface mount oscillator, because of its small size and light weight, is used in portable electronic devices for example, as a reference source of frequencies and time. An example of such a surface mount oscillator is a junction type surface mount oscillator in which a mount substrate, on which an IC chip is fixed, is connected onto a lower surface (outer bottom surface) of a surface mount vibrator so as to be integrated therewith.

Prior Art

FIG. 2 includes drawings for describing a surface mount oscillator of a conventional example, wherein FIG. 2A is a sectional view thereof, and FIG. 2B is a plan view thereof without a surface mount vibrator 1.

As shown in FIG. 2A and FIG. 2B, the conventional surface mount oscillator comprises the surface mount vibrator 1, and a mount substrate 3 having an IC chip 2 fixed on the surface thereof. The surface mount vibrator 1 is such that, for example, both sides of one end section of a crystal piece 5 having a lead-out electrode extending from an excitation electrode (not shown in the drawing), are fixed on an inner bottom surface 4a of a sectionally concave-shaped container main body 4 by means of an electrically conductive adhesive agent 5a. A metallic cover 6, for example, is joined on an opening end surface 4b of the container main body 4 by means of seam welding, to thereby seal-enclose the crystal piece 5 within the container main body 4.

In four corner sections of an outer bottom surface 4c of the container main body 4, there are provided external terminals 7 constituted by a crystal terminal and a ground terminal. The crystal terminal of the external terminal 7 is, for example, provided in one pair of opposing corner sections of the outer bottom surface 4c while being electrically connected to the crystal piece 5, and the ground terminal of the external terminal 7 is provided in the other pair of opposing corner sections while being electrically connected to the metallic cover 6.

The IC chip 2 has IC terminals 8 on one principal surface thereof serving as a circuit formation surface. The IC terminals 8 are constituted by a pair of crystal terminals, a power supply, a ground, an output, and, for example, an AFC terminal. The mount substrate 3 is such that with a glass epoxy base material for example, on one principal surface thereof, there is formed, by means of copper plating, a circuit pattern including joining terminals 9, circuit terminals 10, and a wiring circuit (not shown in the drawing).

Specifically, in four corner sections of the mount substrate 3, there are provided the joining terminals 9 that are electrically and mechanically connected to the external terminals (crystal terminal and ground terminal) 7 of the surface mount vibrator 1, and on each side between the four corner sections of the mount substrate 3, there is provided the circuit terminal 10 that is electrically connected to each IC terminal 8 of the IC chip 2. The external terminal 7 and the joining terminal 9 are connected by a joining ball, that is, a solder ball 11 in which the surface of a metallic ball is coated with lead-free solder, and the IC terminal 8 and the circuit terminal 10 are connected by a gold wire 12 for wire bonding.

Reference symbol 13 in FIG. 2A denotes mount terminals provided on an outer bottom surface 3a of the mount substrate 3, which are electrically connected to a power supply, an output, a ground, and an AFC terminal of the IC terminals 8 for example. Moreover, reference symbol 14 in FIG. 2A denotes a protective resin that is applied for joining the surface mount vibrator 1 and the mount substrate 3.
(See Japanese Unexamined Patent Publication No. 2008-78778, and Japanese Unexamined Patent Publication No. 2004-180012)

Problems in the Prior Art

However, in the surface mount oscillator of the conventional example configured as described above, the external terminals 7 provided in the four corner sections of the container main body 4 of the crystal vibrator 1 are electrically and mechanically connected to the joining terminals 9 provided in the four corner sections of the mount substrate 3 by means of the solder balls 11. Consequently, regarding the size of the IC chip 2 arranged on the mount substrate 3, the size of the rectangular area formed on the inner side of the solder balls 11 is limited as shown in FIG. 2B. Therefore, for example the size of the IC chip 2 becomes smaller than the outer dimension of the surface mount vibrator 1 in plan view.

Due to such a configuration, in a case where a temperature compensation mechanism in addition to an oscillation circuit is integrated into the surface mount oscillator, wiring become complex and designing of the IC chip 2 becomes difficult. Moreover, there has been a problem in that if the size of the IC chip 2 is increased in order to facilitate designing of the IC chip 2, this inhibits miniaturization of the surface mount oscillator (the outer dimension in plan view).

Purpose of the Invention

An object of the present invention is to provide a surface mount oscillator of a junction type that increases the size of an IC chip while maintaining high performance thereof, and that also makes the outer dimension of the entirety of the oscillator in plan view small.

SUMMARY OF THE INVENTION

The present invention is a surface mount crystal oscillator in which: a surface of an
  IC chip opposite to one principal surface thereof on which IC terminals are formed, is fixed on mount terminals of a mount substrate; external terminals constituted by a pair of crystal terminals and dummy terminals, at least one of which serves as a ground terminal, formed in four corner sections of an outer bottom surface of a container main body of a surface mount vibrator, are electrically connected to the IC terminals provided in four corner sections of the one principal surface; and IC terminals provided in positions other than the four corner sections are connected to circuit terminals of the mount substrate by means of wire bonding. In this surface mount crystal oscillator, the configuration is such that the external terminals of the surface mount vibrator constituted by the crystal terminals and the dummy terminals are electrically joined by means of joining balls to the IC terminals formed in the four corner sections of the IC chip.

In the present invention, the joining balls are solder balls. As a result, the joining balls are of a specific configuration. However, the present invention may be applicable to a case where a material other than solder such as eutectic alloy is coated on the surface of metallic balls.

In the present invention, the size of the IC terminals provided in the four corner sections of the IC chip is made larger than that of other IC terminals. As a result, it is possible to make the diameter of the joining ball large. The size of IC terminals other than those described above is maintained small so as to enable wire bonding.

Effect of the Invention

According to such a configuration, the external terminals provided in the four corner sections of the surface mount oscillator (the container main body) are connected to the IC terminals provided in the four corner sections of the IC chip by the joining balls, and it is, therefore, possible to make the size of the IC chip larger than or equal to the outer dimension of the surface mount oscillator in plan view.

BRIEF DESCRIPTION OF THE DRAWINGS

FIG. 1 includes drawings for describing an embodiment of a surface mount oscillator of the present invention, wherein

FIG. 2 includes drawings for describing a surface mount oscillator of a conventional example, wherein

DETAILED DESCRIPTION OF PREFERRED EMBODIMENT

Figure 1A:
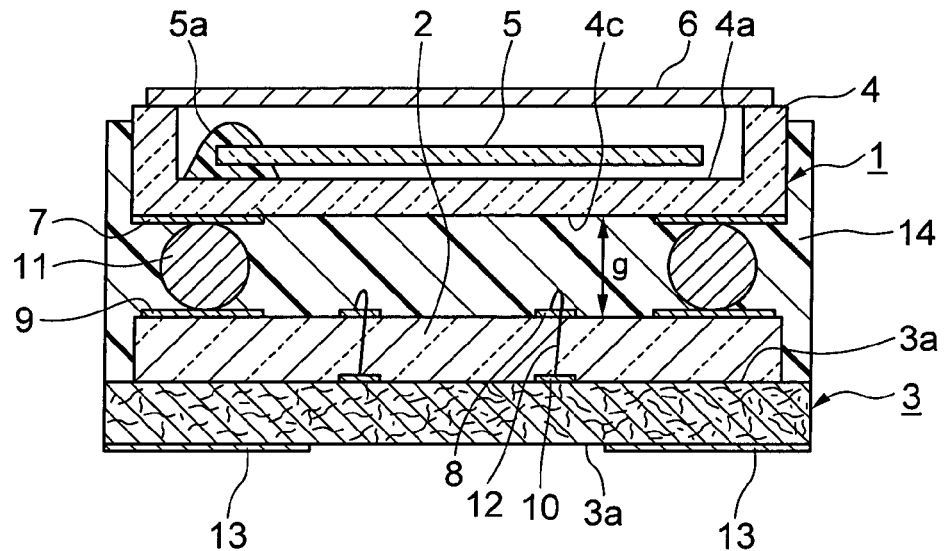
FIG. 1A is a sectional view thereof (except that gold wires 12 for wire bonding, circuit terminals 10, and IC terminals 8 are shown for the sake of convenience)
Figure 1B:
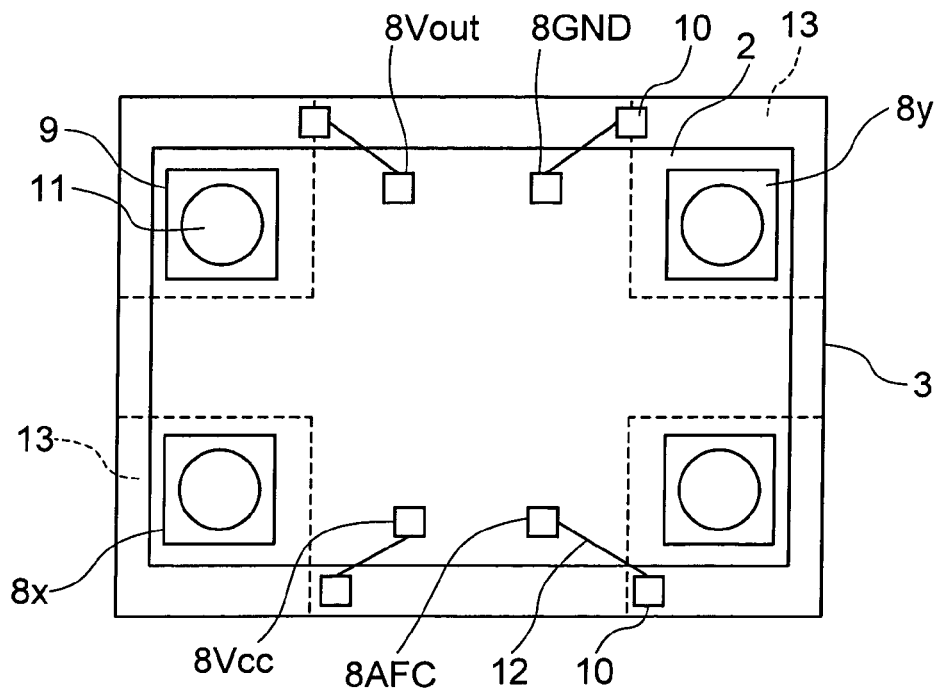
FIG. 1B is a plan view thereof without a surface mount vibrator.
Figure 2A:
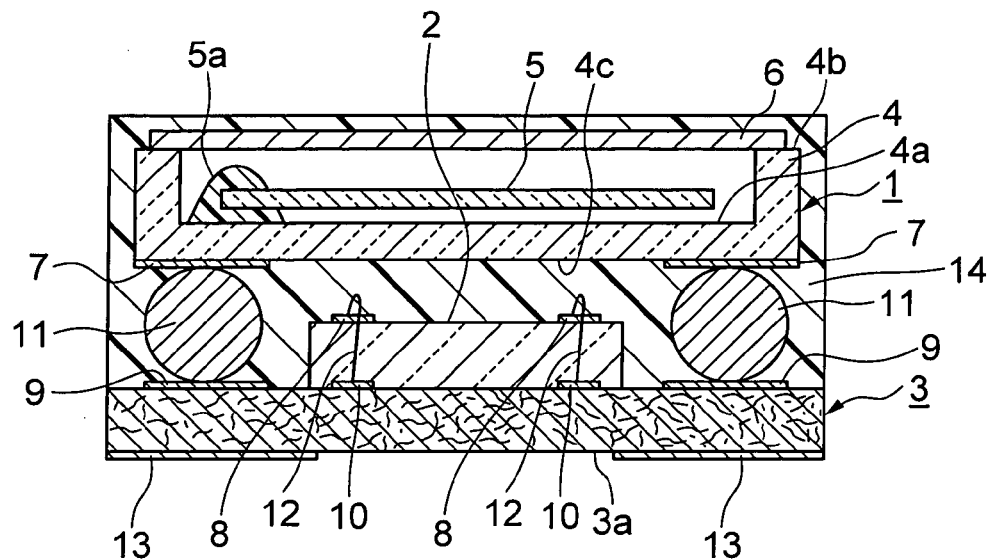
FIG. 2A is a sectional view thereof.
Figure 2B:
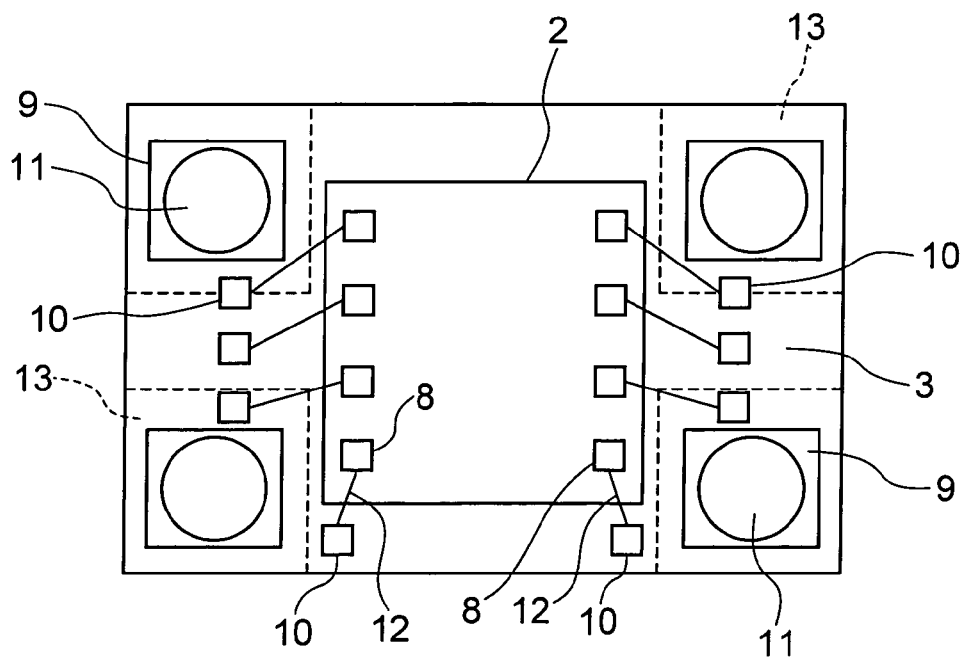
FIG. 2B is a plan view thereof without a surface mount vibrator.

FIG. 1 includes drawings for describing a surface mount oscillator of an embodiment of the present invention, wherein FIG. 1A is a sectional view thereof, and FIG. 1B is a plan view thereof without a surface mount vibrator. The same reference symbols are given to portions the same as those in the aforementioned conventional example, and descriptions thereof are therefore simplified or omitted.

The surface mount oscillator of the present invention, as shown in FIG. 1A, is of a junction type, and is constituted by: a surface mount vibrator 1 in which crystal terminals are provided in one pair of opposing corner sections provided on an outer bottom surface 4c thereof, and external terminals 7 serving as ground terminals are provided in the other pair of opposing corner sections; an IC chip 2; and a mount substrate 3 in which circuit terminals 10 are fixed on a surface opposite to one principal surface of the IC chip 2, on which IC terminals 8 are formed.

As shown in FIG. 1B, the size of the IC terminals 8 (crystal terminals 8x, 8y, and ground terminal 8GND) arranged in one pair of four corner sections of the IC chip 2, is made greater than that of the IC terminals 8 (power supply: 8Vcc, output: 8Vout, and AFC: 8AFC) provided on the other pair of opposing sides. Here, on one of the one pair of opposing sides, there is arranged an IC terminal 8GND that is electrically connected to a ground terminal 8GND respectively in the other pair of opposing corner sections.

As shown in FIG. 1B, the mount substrate 3 is such that it is larger than the IC chip 2 in the outer dimension thereof in plan view, and in periphery regions positioned outside the one pair of opposing long sides of the IC chip 2, there are arranged the circuit terminals 10. The circuit terminals 10 correspond to the IC terminals 8 (8Vcc, 8Vout, 8AFC, and 8GND) other than the crystal terminal 8 (8y) of the IC chip. These circuit terminals 10 extend to the surface opposite to a principal surface 3a of the mount substrate 3 so as to serve as mount terminals 13 of the surface mount oscillator.

In such a surface mount oscillator, as shown in FIG. 1A, first, the surface opposite to the one principal surface of the IC chip 2 on which the IC terminals 8 are formed, is fixed on the surface 3a of the mount substrate 3. In this case, on the surface 3a of the mount substrate 3, there is formed a metal ground pattern (not shown in the drawing), and the opposite side surface (ground surface) of the IC chip 2 is connected to this metal ground pattern. As shown in FIG. 1A, by means of gold wires 12 for wire bonding, the IC terminals 8 (Vcc, Vout, GND, AFC) serving as a power supply, an output, a ground, and an AFC terminal, provided on the one pair of opposing sides of the IC chip 2, are electrically connected to the circuit terminals 10 corresponding thereto.

Next, the external terminals 7 (crystal terminals, and ground terminal) provided in the four corner sections of the outer bottom surface 4c of the container main body 4 of the surface mount vibrator 1 are joined with the IC terminals 8 provided in the four opposite corner sections of the one principal surface of the IC chip 2 corresponding thereto, by means of the joining balls, that is, the solder balls 11 for example. The size of the solder ball 11 is made greater than the loop height of the gold wire 12 for wire bonding in order to prevent the upper end of the loop from coming in contact with the outer bottom surface 4c.

According to such a configuration, the external terminals 7 provided in the four corner sections of the surface mount vibrator 1 are electrically and mechanically connected to the IC terminals 8 provided in the four opposite corner sections of the IC chip 2 by the joining balls 11. Therefore, without the limitation of the IC chip 2 having to fit within the rectangular area formed on the inner side of the solder balls 11 joined on the mount substrate 3 as observed in the surface mount oscillator of the conventional example, the size of the IC chip 2 can be made at least larger than or equal to the size of rectangular area, and, for example, it can be made larger than or equal to the outer dimension of the surface mount vibrator 1 in plan view.

Moreover, since the diameter of the solder ball 1 that joins the surface mount oscillator 1 and the IC chip 2 can freely be made large, a gap g from the bottom surface 4c of the surface mount oscillator 1 can be made large, and it can be made larger than or equal to the loop height of the gold wire 12 for wire bonding to thereby prevent it from coming in contact with the bottom surface 4c.

In the embodiment described above, both of the external terminals provided in the other pair of opposing corner sections of the surface mount vibrator 1 serve as the ground terminals. However, either one thereof may serve as a dummy terminal, and the IC terminal 8 and the circuit terminal 10 corresponding thereto may also serve as a dummy terminal.

What is claimed is:

1. A surface mount crystal oscillator wherein: a surface of an IC chip opposite to one principal surface thereof on which IC terminals are formed, is fixed on a mount substrate; external terminals that are constituted by a pair of crystal terminals and dummy terminals, at least one of which serves as a ground terminal, and that are formed in four corner sections of an outer bottom surface of a surface mount vibrator, are electrically connected to the IC terminals provided in four corner sections of said one principal surface of said IC chip; and IC terminals provided in positions other than said four corner sections are connected to circuit terminals of said mount substrate by means of wire bonding, wherein the external terminals of said surface mount vibrator constituted by the crystal terminals and the dummy terminals are electrically joined by means of joining balls to the IC terminals formed in said four corner sections of said IC chip.

2. A surface mount crystal oscillator according to claim 1, wherein said joining balls are solder balls.

3. A surface mount crystal oscillator according to claim 1, wherein the IC terminals formed in said four corner sections of said IC chip are larger than the IC terminals formed in other portions.

4. A surface mount crystal oscillator wherein: a surface of an IC chip opposite to one principal surface thereof on which IC terminals are formed, is fixed on a mount substrate; external terminals that are constituted by a pair of crystal terminals and dummy terminals, at least one of which serves as a ground terminal, and that are formed in four corner sections of an outer bottom surface of a surface mount vibrator, are electrically connected to the IC terminals provided in four corner sections of said one principal surface of said IC chip; and IC terminals provided in positions other than said four corner sections are connected to circuit terminals of said mount substrate by means of wire bonding, wherein the external terminals of said surface mount vibrator constituted by the crystal terminals and the dummy terminals are electrically joined by means of joining balls to the IC terminals formed in said four corner sections of said IC chip wherein the joining balls are positioned adjacent the IC chip and the surface mount vibrator.

5. A surface mount crystal oscillator according to claim 4, wherein said joining balls are solder balls.

6. A surface mount crystal oscillator according to claim 4, wherein the IC terminals formed in said four corner sections of said IC chip are larger than the IC terminals formed in other portions.

* * * * *